United States Patent
Bretzer et al.

(10) Patent No.: US 10,638,563 B2
(45) Date of Patent: Apr. 28, 2020

(54) VOLTAGE TRANSDUCER FOR A LIGHTING SYSTEM

(71) Applicant: Hubbell Incorporated, Shelton, CT (US)

(72) Inventors: Walter Lawrence Bretzer, Anderson, SC (US); Timothy Eugene Willis, Clemson, SC (US); Christopher Lane Bailey, Greenville, SC (US)

(73) Assignee: Hubell Incorporated, Shelton, CT (US)

( * ) Notice: Subject to any disclaimer, the term of this patent is extended or adjusted under 35 U.S.C. 154(b) by 4 days.

(21) Appl. No.: 16/269,608

(22) Filed: Feb. 7, 2019

(65) Prior Publication Data

US 2019/0254131 A1 Aug. 15, 2019

Related U.S. Application Data

(60) Provisional application No. 62/629,837, filed on Feb. 13, 2018.

(51) Int. Cl.
*H05B 33/08* (2020.01)
*G01R 19/165* (2006.01)

(52) U.S. Cl.
CPC ... *H05B 33/0815* (2013.01); *G01R 19/16528* (2013.01); *H05B 33/086* (2013.01); *H05B 33/0845* (2013.01)

(58) Field of Classification Search
CPC ........... H05B 33/0815; H05B 33/0827; H05B 33/0809; H05B 33/0845; H05B 33/0848; H05B 33/0851; H05B 37/02; H05B 37/029; H05B 33/0842; Y02B 20/347; H02M 1/4225; H02M 1/4258; H02M 3/33523; G01R 19/16528
See application file for complete search history.

(56) References Cited

U.S. PATENT DOCUMENTS

| | | | |
|---|---|---|---|
| 8,022,634 B2 * | 9/2011 | Greenfeld | H05B 33/0815 315/185 R |
| 8,390,214 B2 * | 3/2013 | Van Laanen | H02M 1/4225 315/294 |
| 8,760,078 B2 * | 6/2014 | McCune, Jr. | H05B 33/0815 315/291 |

(Continued)

FOREIGN PATENT DOCUMENTS

WO   WO 2011/008251   1/2011

OTHER PUBLICATIONS

PCT International Search Report and Written Opinion for corresponding PCT Application No. PCT/US2019/016953, dated Apr. 26, 2019, 17 pages.

*Primary Examiner* — Haissa Philogene
(74) *Attorney, Agent, or Firm* — Dority & Manning, PA

(57) ABSTRACT

A voltage transducer for a lighting system can include an input operable to receive an alternating current input power. The voltage transducer can include a current sink circuit operable to provide a current sinking output. The voltage transducer can include one or more control devices configured to determine a magnitude associated with the alternating current input power. The one or more control devices can be further configured to control the current sink circuit to adjust the current sinking output based, at least in part, on the magnitude of the alternating current input power.

20 Claims, 8 Drawing Sheets

(56) References Cited

U.S. PATENT DOCUMENTS

| | | | |
|---|---|---|---|
| 8,964,415 B2* | 2/2015 | Zhu | H02M 1/4258 |
| | | | 363/20 |
| 9,013,114 B2* | 4/2015 | Archenhold | H05B 33/0845 |
| | | | 315/171 |
| 9,954,435 B2* | 4/2018 | Knauss | G01R 19/16538 |
| 10,091,855 B2 | 10/2018 | Van Winkle | |
| 10,236,789 B2* | 3/2019 | Steiner | H02M 7/217 |
| 2003/0006749 A1 | 1/2003 | Rlooman | |
| 2010/0308738 A1 | 12/2010 | Shteynberg et al. | |
| 2012/0153834 A1 | 6/2012 | Moss | |
| 2013/0241427 A1 | 9/2013 | Kesterson et al. | |
| 2015/0097484 A1 | 4/2015 | Lee et al. | |
| 2017/0303363 A1 | 10/2017 | Pyshos et al. | |

* cited by examiner

VOLTAGE TRANSDUCER FOR A LIGHTING SYSTEM

PRIORITY CLAIM

The present application claims the benefit of priority of U.S. Provisional Patent Application No. 62/629,837, titled "Voltage Transducer for a Lighting System," filed Feb. 13, 2018, which is incorporated herein by reference for all purposes.

FIELD

The present disclosure relates generally to lighting systems, and more particularly to a voltage transducer for solid state lighting systems.

BACKGROUND

Solid state lighting systems such as LED lighting systems can include one or more LED devices or other solid state devices that become illuminated as a result of the movement of electrons through a semiconductor material. LED devices are becoming increasingly used in many lighting applications and have been integrated into a variety of products, such as light fixtures, indicator lights, flashlights, and other products. LED lighting systems can provide increased efficiency, life and durability, can produce less heat, and can provide other advantages relative to traditional incandescent and fluorescent lighting systems. Moreover, the efficiency of LED lighting systems has increased such that higher power can be provided at lower cost to the consumer. LED lighting systems can include one or more LED driver circuits that are used to convert input power from an alternating current (AC) power source to a suitable driver current for powering one or more LED devices.

SUMMARY

Aspects and advantages of embodiments of the present disclosure will be set forth in part in the following description, or may be learned from the description, or may be learned through practice of the embodiments.

One example aspect of the present disclosure is directed to a voltage transducer for a lighting system. The voltage transducer can include an input operable to receive an alternating current input power. The voltage transducer can include a current sink circuit operable to provide a current sinking output. The voltage transducer can include one or more control devices configured to determine a magnitude associated with the alternating current input power. The one or more control devices can be further configured to control the current sink circuit to adjust the current sinking output based, at least in part, on the magnitude of the alternating current input power.

Another example aspect of the present disclosure is directed to a method for controlling a lighting system. The method includes receiving an alternating current input power at an input of a voltage transducer. The method includes receiving a sensing input at one or more control devices. The sensing input can be from a power conversion circuit of the voltage transducer. The method includes providing, by the one or more control devices, a control signal to a current sink circuit of the voltage transducer based, at least in part, on the sensing input. The method includes adjusting a current sinking output of the current sinking circuit based, at least in part, on the control signal. The method includes providing the current sinking output to a driver circuit of the lighting system to adjust a driver output the driver circuit provides to a lighting emitting diode light source of the lighting system.

Yet another example aspect of the present disclosure is directed to a lighting system. The lighting system includes a first light source and a second light source. The lighting system further includes a driver circuit and a voltage transducer. The driver circuit is configured to provide a driver current. The voltage transducer includes an input and a current sink circuit. The input is operable to receive an alternating current input power from a power source. The current sink circuit is operable to provide a current sinking output as a variable reference signal provided to a current splitter circuit configured to split the driver current into a first current for the first light source and a second current for the second light source based on the variable reference signal. The lighting system includes one or more control devices configured to determine a magnitude associated with the alternating current input power. The one or more control devices are further configured to control the current sink circuit to adjust the current sinking output based, at least in part, on the magnitude of the alternating current input power.

These and other features, aspects and advantages of the present disclosure will become better understood with reference to the following description and appended claims. The accompanying drawings, which are incorporated in and constitute a part of this specification, illustrate embodiments of the invention and, together with the description, serve to explain the principles of the present disclosure.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
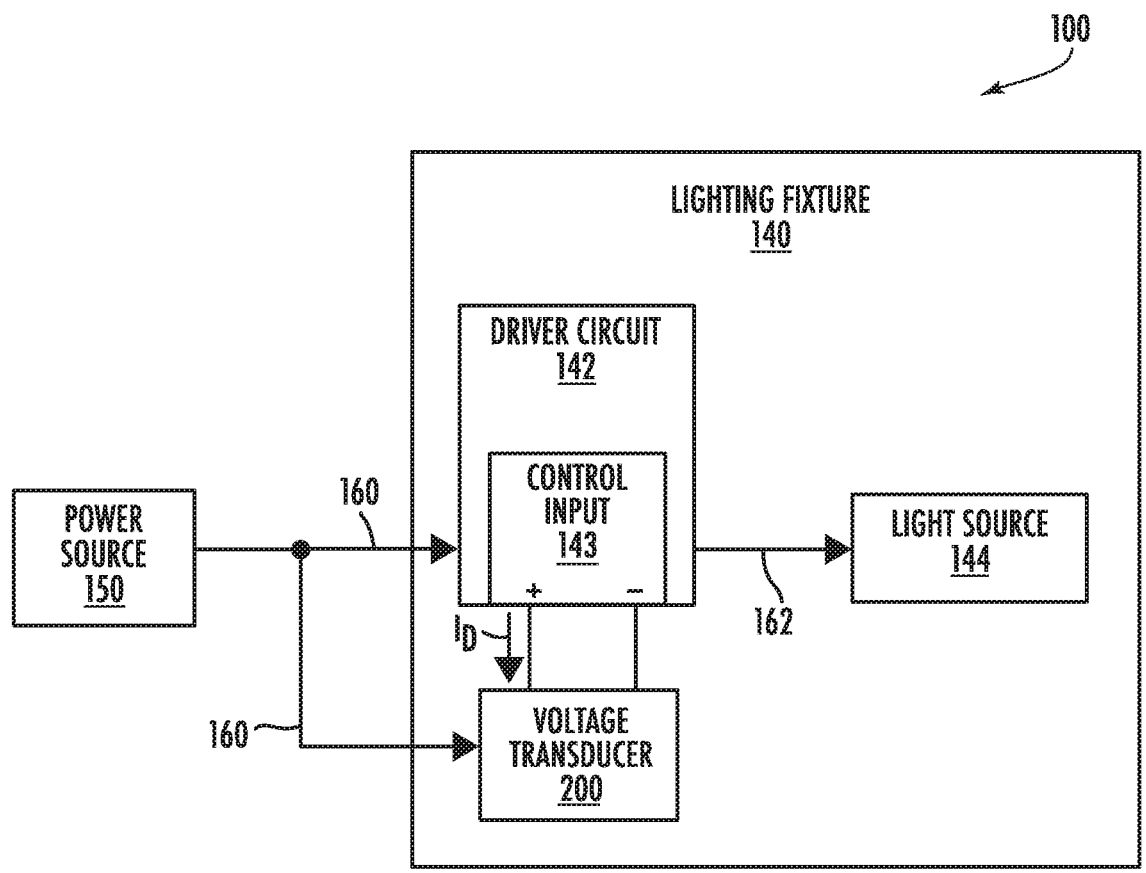
FIG. 1 provides a block diagram of an example lighting system according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to a voltage transducer for a lighting system. The voltage transducer can include an input operable to receive AC input power. The voltage transducer can include a current sink circuit operable to provide a current sinking output to a driver circuit used to power one or more light sources for a lighting fixture. The voltage transducer can include one or more control devices configured to determine a magnitude associated with the AC input power. The one or more control devices can be configured to control the current sink circuit to adjust the current sinking output based on the magnitude of the AC input power.

In some embodiments, the current sinking output can be controlled to adjust a dimming control signal provided to a driver circuit, such as a 0V to 10V dimming control signal. Based on the dimming control signal, the driver circuit can dim or adjust the brightness of one or more light sources (e.g., LEDs) powered by the driver circuit. In this manner, the voltage transducer can facilitate dimming of the one or more light sources in a lighting fixture based on a magnitude of the input AC voltage received at the lighting fixture.

In some embodiments, the voltage transducer can be used in conjunction with a current splitter circuit. More particularly, the current sinking output can be controlled to adjust a variable reference signal (e.g., 0V to 10V control signal) to the current splitter circuit. Based on the adjustment to the variable reference signal, a ratio of current split among a plurality of light sources can be adjusted, for instance, to change a color temperature of light output by the one or more light sources.

Aspects of the present disclosure are discussed with reference to a 0V to 10V control signal for purposes of illustration and discussion. Those of ordinary skill in the art, using the disclosures provided herein, will understand that other suitable dimming control signals can be used without deviating from the scope of the present disclosure.

In some embodiments, the voltage transducer can include a power conversion circuit configured to convert the alternating current input power to direct current power for powering the one or more control devices. The power conversion circuit can include at least one of a transformer, a rectifier, a voltage regulator, and a sensing circuit. The transformer can be configured to convert a first AC voltage associated with the AC input power to a second AC voltage. The second AC voltage can be lower than the first AC voltage. The rectifier can be configured to convert the second AC voltage to a first direct current (DC) voltage. The voltage regulator can be configured to convert the first DC voltage to a regulated second DC voltage that is provided to power the one or more control devices (e.g., a microcontroller). The sense circuit can convert the second AC voltage to a sensing input (e.g., a DC sensing input) that can be provided to the one or more control devices. The sensing input is indicative of the magnitude of AC input power received at the voltage transducer.

In some embodiments, the one or more control devices can be configured to provide a control signal to the current sink circuit based, at least in part, on the sensing input. As an example, the control signal can be a pulse width modulated (PWM) control signal having a variable duty cycle. More specifically, the duty cycle can vary based, at least in part, on the magnitude of the AC input power.

In some embodiments, the current sink circuit can include an operational amplifier (or other comparator circuit) and a switching device. The operational amplifier can include an inverting input, a non-inverting input, and an output. The control signal can be provided to the non-inverting input of the operational amplifier, and the output can be configured to control operation of the switching device based on the control signal.

In some embodiments, the current sink circuit can include a feedback loop coupled between the output of the operational amplifier and the inverting input of the operational amplifier. The operational amplifier can be operated as a comparator configured to compare a voltage associated with the control signal and a voltage associated with the feedback loop. When the operational amplifier determines a difference between the voltage associated with the control signal and the voltage associated with the feedback loop does not exceed a threshold, the output of the operational amplifier can control the switching device to be in a conducting state. Conversely, the output of the operational amplifier can control the switching device to be in a non-conducting state when the difference exceeds the threshold.

In example embodiments, the operational amplifier can control operation of the switching device to adjust (e.g., increase or decrease) a current sinking output associated with the current sink circuit. More specifically, the current sinking output can be a dimming control signal received at the driver circuit. The dimming control signal can control the driver output (e.g., current) the driver circuit provides to the one or more light source. For instance, the dimming control signal can control the magnitude of the current the driver circuit provides to the one or more light sources (e.g., LEDs). In this manner, the current sink circuit can facilitate dimming of the one or more light sources based, at least in part, on the magnitude of the AC input power.

The voltage transducer according to example embodiments of the present disclosure can provide a number of technical effects and benefits. For instance, the voltage transducer can monitor the AC input power provided to the lighting fixture and adjust a driver output to one or more light sources (e.g., LEDs) to dim the light sources in response to detecting a change (e.g., decrease) in a magnitude of the AC input power. In this manner, one or more light sources in the lighting system can be effectively dimmed by controlling the magnitude of the AC input power provided to the lighting fixtures.

Example aspects of the present disclosure are directed to a lighting fixture. The lighting fixture can include one or more light sources. The lighting fixture can include a driver circuit configured to provide a driver output to the one or more light sources. The lighting fixture can include a voltage transducer operable to provide a dimming control signal to the driver circuit. The voltage transducer can include an input and a current sink circuit. The input can receive an alternating current input power from a power source. The current sink circuit can be operable to provide a current sinking output as the dimming control signal to the driver circuit. The lighting fixture can include one or more control devices configured to determine a magnitude associated with the alternating current input power. The one or more control devices can be further configured to control the current sink circuit to adjust the current sinking output based, at least in part, on the magnitude of the alternating current input power.

As used herein, a lighting system can include, but is not limited to, one or more of a lighting circuit, light engine, one or more luminaires, one or more lighting fixtures, one or more lighting units, a plurality of lighting devices arranged in an environment, a combination of any of the foregoing, or other lighting system. The use of the term "about" in conjunction with a numerical value is intended to refer to within 25% of the stated amount.

Referring now to the FIGS., FIG. 1 depicts a lighting system 100 according to example embodiments of the present disclosure. As shown, the lighting system 100 can include one or more lighting fixtures 140. In example embodiments, the one or more lighting fixtures 140 can include a driver circuit 142 and one or more light emitting diode (LED) light sources 144. Aspects of the present disclosure can be used with other suitable light sources without deviating from the scope of the present disclosure.

In example embodiments, the driver circuit 142 can be configured to receive AC input power 160 from a power source 150 and convert the AC input power 160 to a driver output 162 (e.g., driver current) suitable for powering the one or more LED light sources 144. The driver circuit 142 can include various components, such as switching elements (e.g., transistors). Gate timing commands can be provided to the one or more switching elements to convert the AC input power 160 to the driver output 162.

According to example aspects of the present disclosure, the one or more lighting fixtures 140 can include a voltage transducer 200. In example embodiments, the voltage transducer 200 can be configured to provide one or more dimming control signals to the driver circuit 142 to control dimming of the one or more LED light sources 144 based on the magnitude of the AC input power 160.

In example embodiments, the driver circuit 142 can adjust the driver output 162 based at least in part on a dimming control signal (e.g., 0V to 10V dimming control signal). More specifically, the dimming control signal can be indicative of a voltage (e.g., 0V to 10V) at a control input 143 of the driver circuit 142. For example, reducing the dimming control signal by 50% can result in a corresponding reduction in the driver output 162. The reduction of the driver output 162 can reduce the overall driver current for supply to the one or more LED light sources 144. As a result, the lumen output of the one or more LED light sources 144 can be adjusted (e.g., dimmed) by varying the dimming control signal.

In example embodiments, the driver circuit 142 can provide a control current $I_D$ to the voltage transducer 200 via the control input 143. The magnitude of the control current $I_D$ can determine the dimming control signal. For instance, a higher magnitude of the control current $I_D$ can be associated with a 10 V dimming control signal, whereas a lower magnitude of the control current $I_D$ can be associated with a 2 V dimming control signal. The voltage transducer 200 can be configured to sink the control current $I_D$ based, at least in part, on the magnitude of the AC input power 160. In this manner, the voltage transducer 200 can adjust the magnitude of the dimming control signal to dim or brighten the one or more LED light sources 144.

Figure 2:
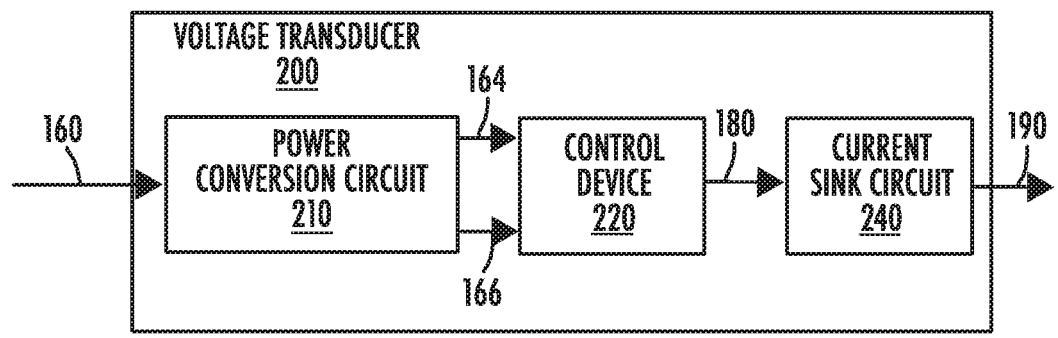
FIG. 2 provides a block diagram of an example voltage transducer according to example embodiments of the present disclosure.

FIG. 2 depicts a block diagram of the voltage transducer 200 according to example embodiments of the present disclosure. As shown, the voltage transducer 200 can include a power conversion circuit 210, one or more control devices 220, and a current sink circuit 240. The power conversion circuit 210 can be configured to receive the AC input power 160 and convert the AC input power 160 to direct current (DC) power. More specifically, the power conversion circuit 210 can include various electrical components (e.g., resistors, capacitors, diodes, etc.) configured to convert the AC input power 160 to the DC power 164. Alternatively or additionally, the power conversion circuit 210 can be configured to determine a sensing input 166 based, at least in part, on the AC input power 160. In example embodiments, the sensing input 166 can indicate a magnitude of the AC input power 160. More specifically, the sensing input 166 can be a direct current (DC) sensing input.

The power conversion circuit 210 can provide the DC power 164 and sensing input 166 to the one or more control devices 220. In example embodiments, the one or more control devices 220 can include a microcontroller having one or more processors and associated memory devices. More specifically, the one or more control devices 220 can be configured to provide a control signal 180 to the current sink circuit 240 based, at least in part, on the sensing input 166.

Although FIG. 2 depicts the one or more control devices 220 as being a component of the voltage transducer 200, it should be appreciated that the one or more control devices 220 can be a component of any suitable component of the lighting fixture 140. For instance, the control one or more control devices 220 can, in alternative embodiments, be a component of the driver circuit 142. Alternatively, the one or more control devices 220 can be a standalone component within the lighting fixture 140.

Figure 3:
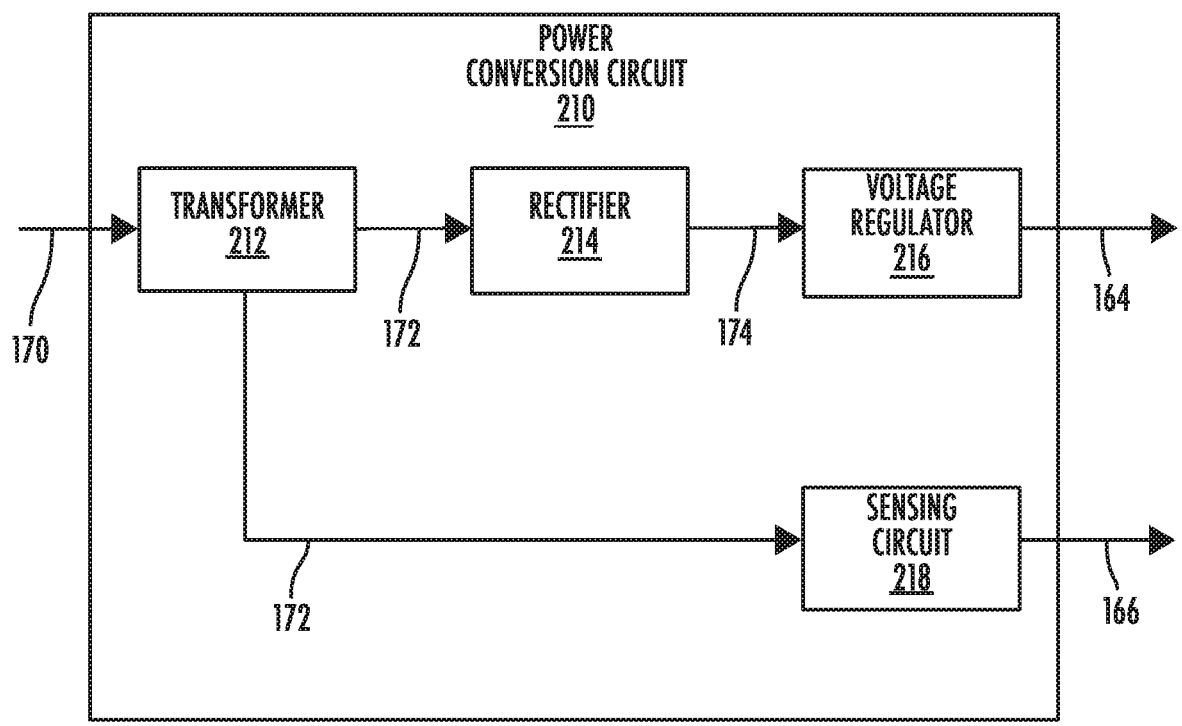
FIG. 3 provides a block diagram of an example power conversion circuit used in a voltage transducer according to example embodiments of the present disclosure.

Referring now to FIG. 3, a block diagram of components of the power conversion circuit 210 is provided according to example embodiments of the present disclosure. As shown, the power conversion circuit 210 can include a transformer 212 configured to convert a first AC voltage 170 associated with the AC input power 160 (FIG. 1) to a second AC voltage 172. More specifically, the transformer 212 can be a step-down transformer, and a magnitude of the second AC voltage 172 can be less than a magnitude of the first AC voltage 170.

As shown, the power conversion circuit 210 can include a rectifier 214 and a voltage regulator 216. The rectifier 214 can be configured to convert the second AC voltage 172 to a first direct current (DC) voltage 174. More specifically, the rectifier 214 can be a half-wave rectifier or a full-wave rectifier. The voltage regulator 216 can be configured to convert the first DC voltage 174 to a second DC voltage. In example embodiments, the second DC voltage can be less than the first DC voltage 174. It should be appreciated that the second DC voltage can be associated with the DC power 164 the power conversion circuit 210 provides to the control devices 220 (FIG. 3).

The power conversion circuit 210 can include a sensing circuit 218 configured to convert the second AC voltage 172 to the sensing input 166 that can be provided to the one or more control devices 220 (FIG. 2). As discussed above, the one or more control devices 220 can provide the control signal 180 (FIG. 2) to the current sink circuit 240 (FIG. 2) based, at least in part, on the sensing input 166. As will be discussed below in more detail, the one or more control devices 220 can be programmed to generate the control signal 180 according to one or more control curves defining a relationship between the sensing input 166 and the control signal 180.

Figure 4:
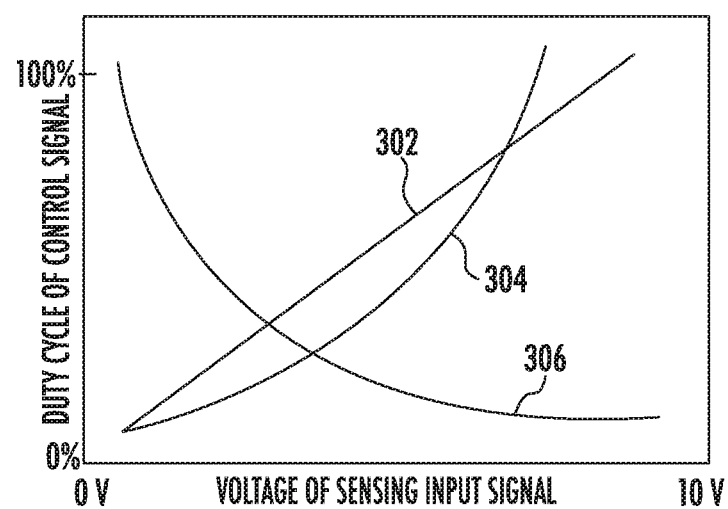
FIG. 4 depict example control curves programmed into a control device according to example embodiments of the present disclosure.

Referring now to FIG. 4, example control curves are provided according to example aspects of the present disclosure. The control curves can be implemented by the one or more control devices 220 (e.g., microcontroller). As shown, FIG. 4 plots a magnitude of the sensing input 166 (FIG. 2) along the horizontal axis and a duty cycle of the control signal 180 (FIG. 2) along the vertical axis. More specifically, three example control curves 302, 304, and 306 are depicted. As will be discussed below in more detail, each curve 302, 304, and 306 is defined based on a relationship between a magnitude of a voltage associated with the sensing input 166 and a duty cycle of the control signal 180.

Curve 302 may be defined based on a linear relationship between the voltage associated with the sensing input 166 (FIG. 2) and a duty cycle of the control signal 180 (FIG. 2). In example embodiments, the one or more control devices 220 (FIG. 2) can be configured to provide the control signal 180 based on curve 302. In this manner, the one or more control devices 220 can be configured to linearly increase or linearly decrease the duty cycle of the control signal 180 based on the magnitude of the sensing input 166. For instance, the one or more control devices 220 can be configured to linearly increase the duty cycle of the control signal 180 as the magnitude of the voltage associated with the sensing input 166 increases. Conversely, the one or more control devices 220 can be configured to linearly decrease the duty cycle of the control signal 180 as the magnitude of the voltage associated with the sensing input 166 decreases.

Curve 304 may be defined based on an exponential relationship between the voltage associated with the sensing input 166 and the duty cycle of the control signal 180. In this manner, the one or more control devices 220 can be configured to exponentially increase or exponentially decrease the duty cycle of the control signal 180 based on the magnitude of the sensing input 166. For instance, the one or more control devices 220 can be configured to exponentially increase the duty cycle of the control signal 180 as the magnitude of the voltage associated with the sensing input 166 increases. Conversely, the one or more control devices 220 can be configured to exponentially decrease the duty cycle of the control signal 180 as the magnitude of the voltage associated with the sensing input 166 decreases.

Curve 306 may be defined based on an inverse exponential relationship between the voltage associated with the sensing input 166 and the duty cycle of the control signal 180. In this manner, the one or more control devices 220 can be configured to exponentially decrease the duty cycle of the control signal 180 as the magnitude of the voltage associated with the sensing input 166 increases. Conversely, the one or more control devices 220 can be configured to exponentially increase the duty cycle of the control signal 180 as the magnitude of the voltage associated with the sensing input 166 decreases.

Figure 5:
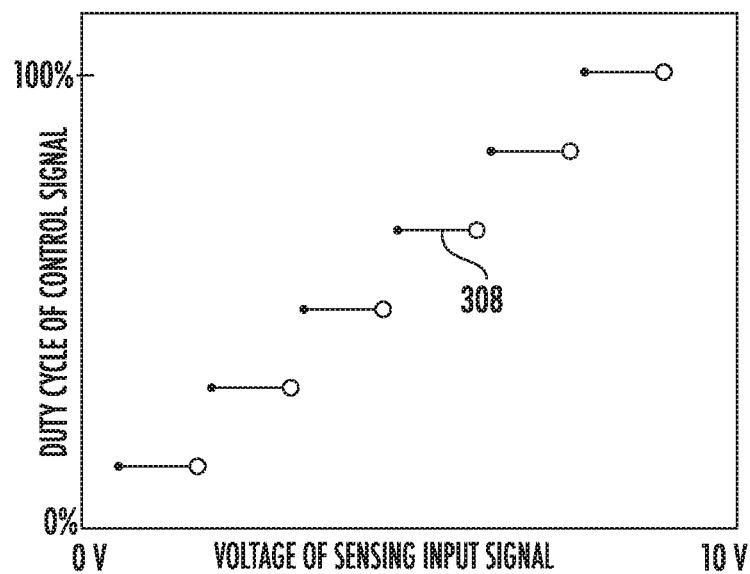
FIG. 5 depict example control curves programmed into a control device according to example embodiments of the present disclosure.

Referring now to FIG. 5, an example control curve 308 defined based on a step function is provided according to example embodiments of the present disclosure. The control one or more control devices 220 can be configured to provide the control signal 180 (FIG. 2) based on curve 308. In this manner, the one or more control devices 220 can be configured to increase the duty cycle of the control signal 180 in an incremental fashion as the magnitude associated with the sensing input 166 increases. Conversely, the one or more control devices 220 can be configured to decrease the duty cycle of the control signal in an incremental fashion as the magnitude associated with the sensing input 166 decreases.

Figure 6:
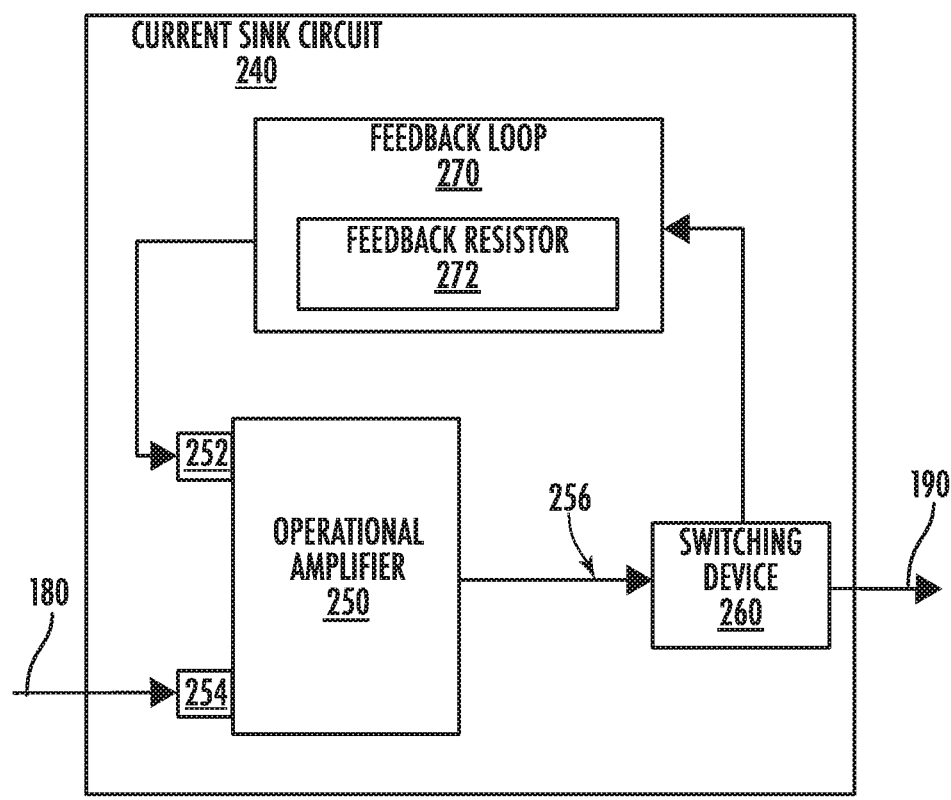
FIG. 6 provides a block diagram of an example current sink circuit used in a voltage transducer according to example embodiments of the present disclosure.

FIG. 6 depicts a block diagram of the current sink circuit 240 according to example embodiments of the present disclosure. As shown, the current sink circuit 240 can include an operational amplifier 250 and a switching device 260. The operational amplifier 250 can include an inverting input 252, a non-inverting input 254, and an output 256. In example embodiments, the control signal 180 can be provided to the non-inverting input 254.

The switching device 260 can be in operative communication with the output 256 of the operational amplifier 250. In example embodiments, the switching device 260 can include one or more transistors For example, in some implementations, the transistor can be a positive-negative-positive (PNP) bipolar junction transistor. It should be appreciated, however, that the switching device 260 can include any suitable type of transistor. For instance, the switching device 260 can be a metal-oxide field effect transistor (MOSFET) or other suitable switching device.

The current sink circuit 240 can include a feedback loop 270 coupled between the output 256 of the operational amplifier 250 and the inverting input 252 of the operational amplifier 250. More specifically, the feedback loop 270 can include a feedback resistor 272. It should be appreciated that the feedback resistor 272 can have any suitable resistance value.

In example embodiments, the operational amplifier 250 can be operated as a voltage comparator. More specifically, the operational amplifier 250 can be configured to compare a voltage associated with the control signal 180 and a voltage associated with the feedback loop 270. When the operational amplifier 250 determines a difference between the voltage associated with the control signal 180 and the voltage associated with the feedback loop 270 does not exceed a threshold, the output 256 of the operational amplifier 250 can control the switching device 260 to be in a conducting state. Conversely, the output 256 of the operational amplifier 250 can control the switching device 260 to be in a non-conducting state when the difference between the voltage associated with the control signal 180 and the voltage associated with the feedback loop 270 exceeds the threshold.

In example embodiments, the output 256 of the operational amplifier 250 can control the switching device 260 to adjust (e.g., increase or decrease) a current sinking output 190 of the current sink circuit 240. In some implementations, the current sinking output 190 can be a dimming control signal received at the control input 143 (FIG. 1) of the driver circuit 142 (FIG. 1). In this manner, the current sink circuit 240 can control the lumen output of the LED light source 144.

Figure 7:
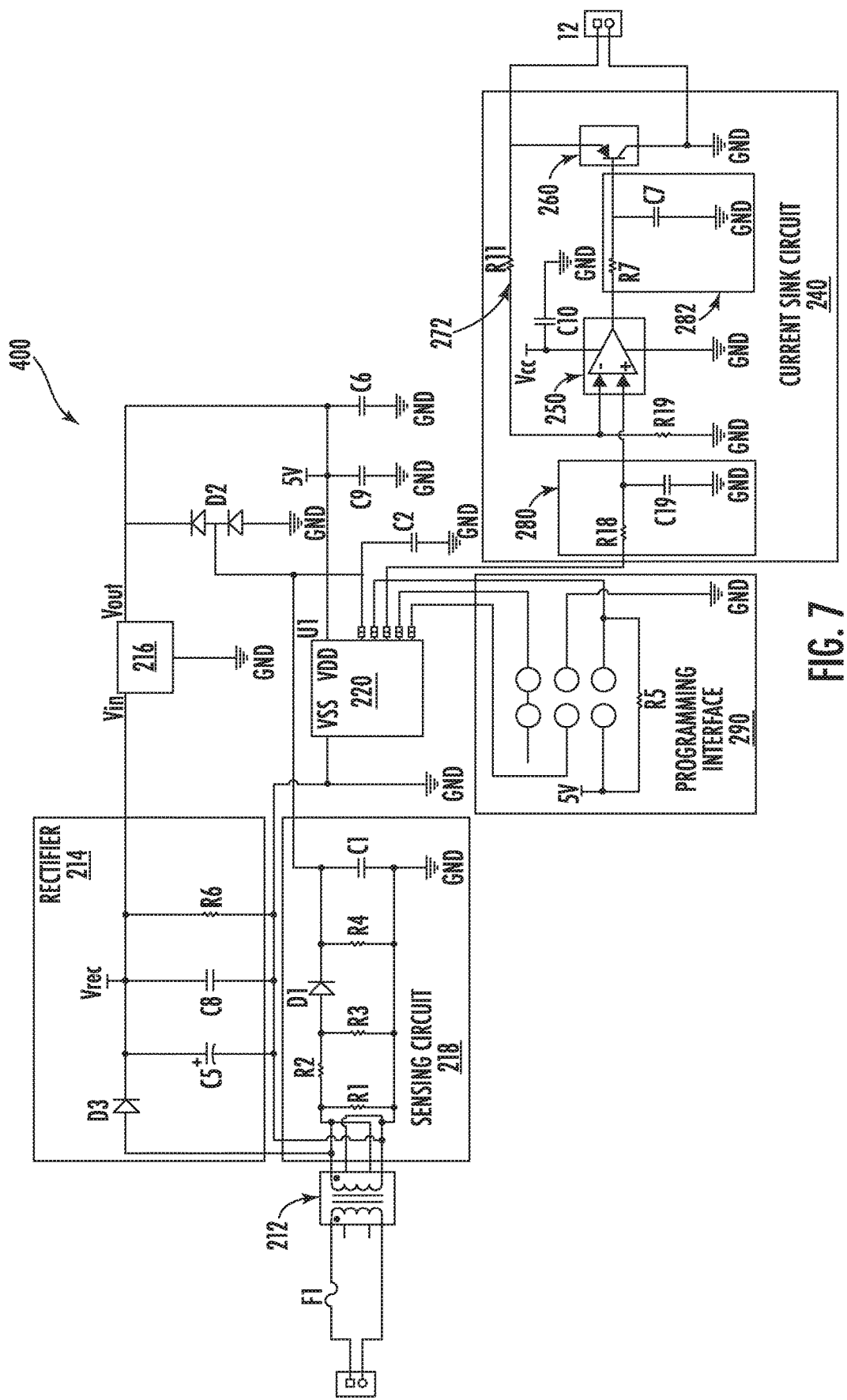
FIG. 7 provides a circuit diagram of an example voltage transducer according to example embodiments of the present disclosure.

FIG. 7 depicts a circuit diagram of the voltage transducer 200 according to example embodiments of the present disclosure. As shown, the voltage transducer 200 can include a fuse F1 coupled between the power source 150 (FIG. 1) and the transformer 212. Alternatively or additionally, the sensing circuit 218 can include various electrical components (e.g., resistors, diodes, capacitors) configured to convert AC power to DC power. More specifically, the sensing circuit 218 can include a plurality of resistors (e.g., R1, R2, R3 and R4), a Schottky diode D1, and a capacitor C1 configured as shown.

The rectifier 214 can include various electrical components configured to convert AC power to DC power. More specifically, the rectifier 214 can include a Schottky diode D3, a resistor R6, and capacitors C5, C8 configured as shown. It should be appreciated that capacitor C5 can be polarized (e.g., electrolytic) and capacitor C8 can be non-polarized.

The current sink circuit 240 can include a first filter 280 coupled between the control device 220 and the operational amplifier 250. More specifically, the first filter 280 can be a low-pass filter that includes a resistor R18 and a capacitor C19 coupled between the resistor R18 and ground GND. Alternatively or additionally, the current sink circuit 240 can include a second filter 282 coupled between the output of the operational amplifier 250 and the switching device 260. More specifically, the second filter 282 can be a low-pass filter that includes a resistor R7 and a capacitor C7 coupled between the resistor R7 and ground GND.

The feedback resistor 272 of the feedback loop 270 corresponds to resistor R11. As shown, resistor R11 can be coupled between the switching device 260 and the inverting input 252 (FIG. 6) of the operational amplifier 250. The current sink circuit 240 can include a resistor R19 coupled between the inverting input 252 (FIG. 6) and ground GND. In this manner, resistor R11 and R19 form a voltage divider.

The switching device 260 of the current sink circuit 240 is shown as a PNP transistor. More specifically, the PNP transistor can include a base input B, an emitter input E, and a collector input C. As shown, the base input B can be coupled to the output 256 (FIG. 6) of the operational amplifier 250 via the second filter 282. The emitter input E can be coupled to resistor R11 (e.g., the feedback resistor 272), and the collector input C can be coupled to ground GND.

As shown, the current sink circuit 240 can include a programming interface 290 communicatively coupled to the one or more control devices 220. In example embodiments, the programming interface 290 can include one or more inputs that can be used to program the one or more control devices 220. For instance, the one or more inputs can be used to program the one or more control devices 220 based on one or more of the control curves discussed above with reference to FIGS. 4 and 5.

Figure 8:
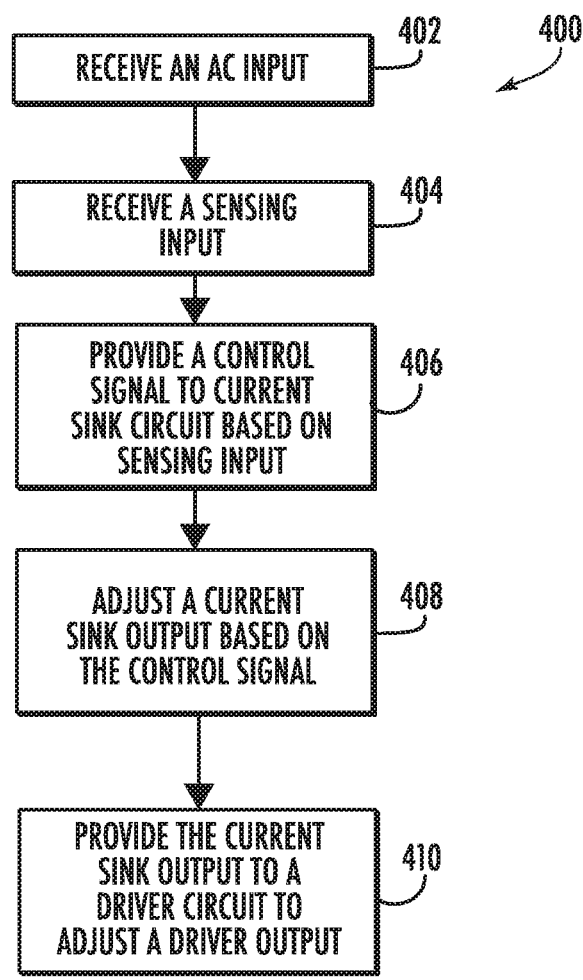
FIG. 8 provides a flow diagram of an example method according to example embodiments of the present disclosure.

Referring now to FIG. 8, a flow diagram of one example method 400 for controlling operation of a lighting system is provided according to example embodiments of the present disclosure. In general, the method 400 will be discussed herein with reference to the lighting system 100 described above with reference to FIGS. 1 through 7. However, it should be appreciated by those of ordinary skill in the art that the disclosed method 400 can generally be implemented with lighting systems having any other suitable configuration. In addition, although FIG. 8 depicts steps performed in a particular order for purposes of illustration and discussion, the method discussed herein is not limited to any particular order or arrangement. One skilled in the art, using the disclosure provided herein, will appreciate that various steps of the method 400 disclosed herein can be omitted, rearranged, combined, and/or adapted in various ways without deviating from the scope of the present disclosure.

At (402), the method 400 can include receiving, at an input of a voltage transducer, an alternating current (AC) input power. In example embodiments, the input of the voltage transducer can receive the AC input power from a power source, such as a mains power supply.

At (404), the method 400 can include receiving, at one or more control devices, a sensing input from a power conversion circuit of the voltage transducer. In example embodiments, the sensing input can indicate a magnitude of the AC input power. More specifically, the sensing input can indicate the magnitude of an AC voltage associated with the AC input power.

At (406), the method 400 can include providing, by the one or more control devices, a control signal to a current sink circuit of the voltage transducer based, at least in part, on the sensing input. In example embodiments, the control signal can be a PWM signal having a variable duty cycle. More specifically, the duty cycle of the PWM signal can be based, at least in part, on the sensing input received at (404).

At (408), the method 400 can include adjusting, by the current sink circuit, a current sinking output of the current sinking circuit based, at least in part, on the control signal. In example embodiments, adjusting the current sinking output can include controlling a switching device of the current sink circuit based, at least in part, on a voltage associated with the control signal. For example, controlling operation of the switching device can include operating the switching device in a conducting state when a difference between a voltage associated with the control signal and a voltage associated with a feedback loop of the current sink circuit does not exceed a threshold. Alternatively, controlling operation of the switching device can include operating the switching device in a non-conducting state when a difference between the voltage associated with the control signal and a voltage associated with a feedback loop of the current sink circuit does exceed the threshold.

At (410), the method 400 can include providing, by the current sink circuit, the current sinking output to a driver circuit of the light system. In example embodiments, the current sink circuit can provide the current sinking output to a driver circuit to adjust a driver output (e.g., a DC voltage) the driver circuit provides to a light source, such as a LED light source. More specifically, the current sinking output can be a dimming control signal (e.g., 0V to 10 V). In this manner, the voltage transducer can dim or brighten the light source in response to one or more adjustments made to the AC input power.

Figure 9:
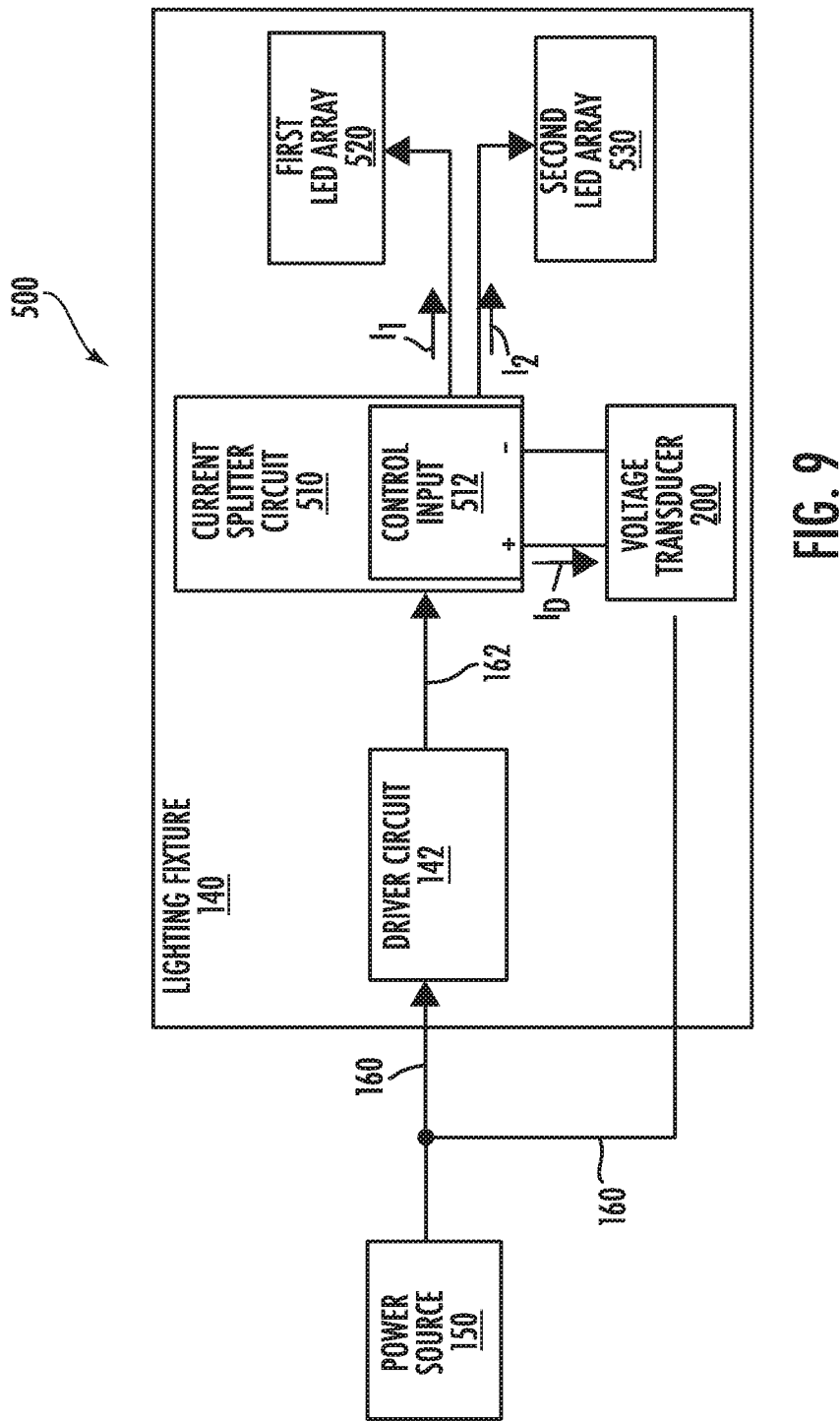
FIG. 9 provides a block diagram of an example lighting system according to example embodiments of the present disclosure.

Referring now to FIG. 9, another example of a lighting system 500 is provided according to example embodiments of the present disclosure. As shown, several components of the lighting system 500 are similar to components of the lighting system 100 depicted in FIG. 1. For instance, the lighting system 500 includes the driver circuit 142 and voltage transducer 200. However, the lighting system 500 of FIG. 9 also includes a current splitter circuit 510 in operative communication with the driver circuit 142 and the voltage transducer 200. Additionally, the lighting fixture 140 of FIG. 9 includes a first LED array 520 and a second LED array 530.

As illustrated in FIG. 9, the current splitter circuit 510 can be configured to convert the driver output 162 into a first current $I_1$ for powering the first LED array 520 and a second current $I_2$ for powering a second LED array 530. In this manner, the current splitter circuit 510 can be used to adjust the lumen output of the first LED array 520 relative to the lumen output of the second LED array 530. The current splitter circuit 510 can be configured to control the current ratio of the first current $I_1$ provided to the first LED array 520 and the second current $I_2$ provided to the second LED array 530.

As an example, the first LED array 520 can be associated with a different color temperature relative to the second LED array 530. As a variable reference signal the voltage transducer 200 provides to the current splitter circuit 510 is adjusted, for instance, from 0V to 10V, the current splitter circuit 510 can adjust the ratio of the first current $I_1$ provided to the first LED array 520 relative to the second current $I_2$ provided to the second LED array 530. In this manner, the amount of light emitted by the first LED array 520 at a first color temperature can be adjusted relative to the amount of light emitted by the second LED array 530 at a second color temperature, resulting in a different overall color temperature of the light output of the lighting system 500.

As another example, the first LED array 520 can be associated with a first lighting direction (e.g. to provide uplighting) and the second LED array 530 associated with a second lighting direction (e.g. to provide downlighting). As the variable reference signal provided to the current splitter circuit 510 is adjusted, for instance, from 0V to 10V, the current splitter circuit 510 can adjust the ratio of the current provided to the first LED array 520 relative to the current provided to the second LED array 530. In this manner, the amount of lighting in the first direction can be adjusted relative to the amount of lighting in the second direction to provide different lighting effects in the lighting system 500.

Aspects of the present disclosure are discussed with reference to first and second LED arrays 520, 530 having different color temperature for purposes of illustration and discussion. The first and second LED arrays 520, 530 can include many other suitable variations without deviating from the scope of the present disclosure. For instance, the first and second LED arrays 520, 530 can be associated with a different brightness, different lighting direction, different layout, or other suitable characteristics. Alternatively or additionally, the first and second LED arrays 520, 530 can be implemented on the same circuit board or on different circuit boards.

The current splitter circuit 510 can include one or more control devices (e.g., a microprocessor, a microcontroller, logic device, etc.) and one or more switching elements (e.g., transistors) in line with each of the first LED array 520 and the second LED array 530. The one or more control devices can control the amount of current provided to the first LED array 520 and the second LED array 530 by controlling the switching elements. The switching elements used to control the amount of current provided to the first LED array 520 and to the second LED array 530 can be either on the low voltage side of the LED arrays or the high voltage side of the LED arrays.

In example embodiments, the current splitter circuit 510 can adjust the current ratio based at least in part on the variable reference signal (e.g., 0V to 10 V) that is received as the current sinking output 190 (FIG. 2) of the voltage transducer 200.

In example embodiments, the current splitter circuit 510 can output a control current $I_D$ to the voltage transducer 200 via the control input 512. The magnitude of the control current $I_D$ can determine the variable reference signal. For instance, a higher magnitude of the control current $I_D$ can be associated with a 10 V variable reference signal, whereas a lower magnitude of the control current $I_D$ can be associated with, for instance, a 2 V variable reference signal. The voltage transducer 200 can be configured to sink the control current $I_D$ based, at least in part, on the magnitude of the AC input power 160. In this manner, the voltage transducer 200 can adjust the variable reference signal based on the magnitude of the AC input power 160 to adjust a current ratio between the first and second LED arrays 520, 530.

In particular aspects, the one or more control devices can control the current provided to the first LED array 520 and to the second LED array 530 according to a current ratio control curve based on the variable reference signal. The current ratio control curve can be stored in firmware or stored in a memory accessible by the one or more control devices. The current ratio control curve can specify the current ratio of the first current provided to the first LED array 520 and the second current provided to the second LED array 530 as a function of at least the variable reference signal.

The current ratio control curve can be provided in any suitable format. For instance, the current ratio control curve can be provided as a look up table, matrix, correlation, or other data specifying the current ratio as a function of at least the variable reference signal. The current ratio control curve can be defined based on any desired relationship between the current ratio and the variable reference signal. For instance, the current ratio control curve can be designed as linear, super-linear, parabolic, logarithmic, asymptotic, exponential, as a step function, or other relationship between the current ratio and the variable reference signal, depending on the desired performance of the lighting system.

Figure 10:
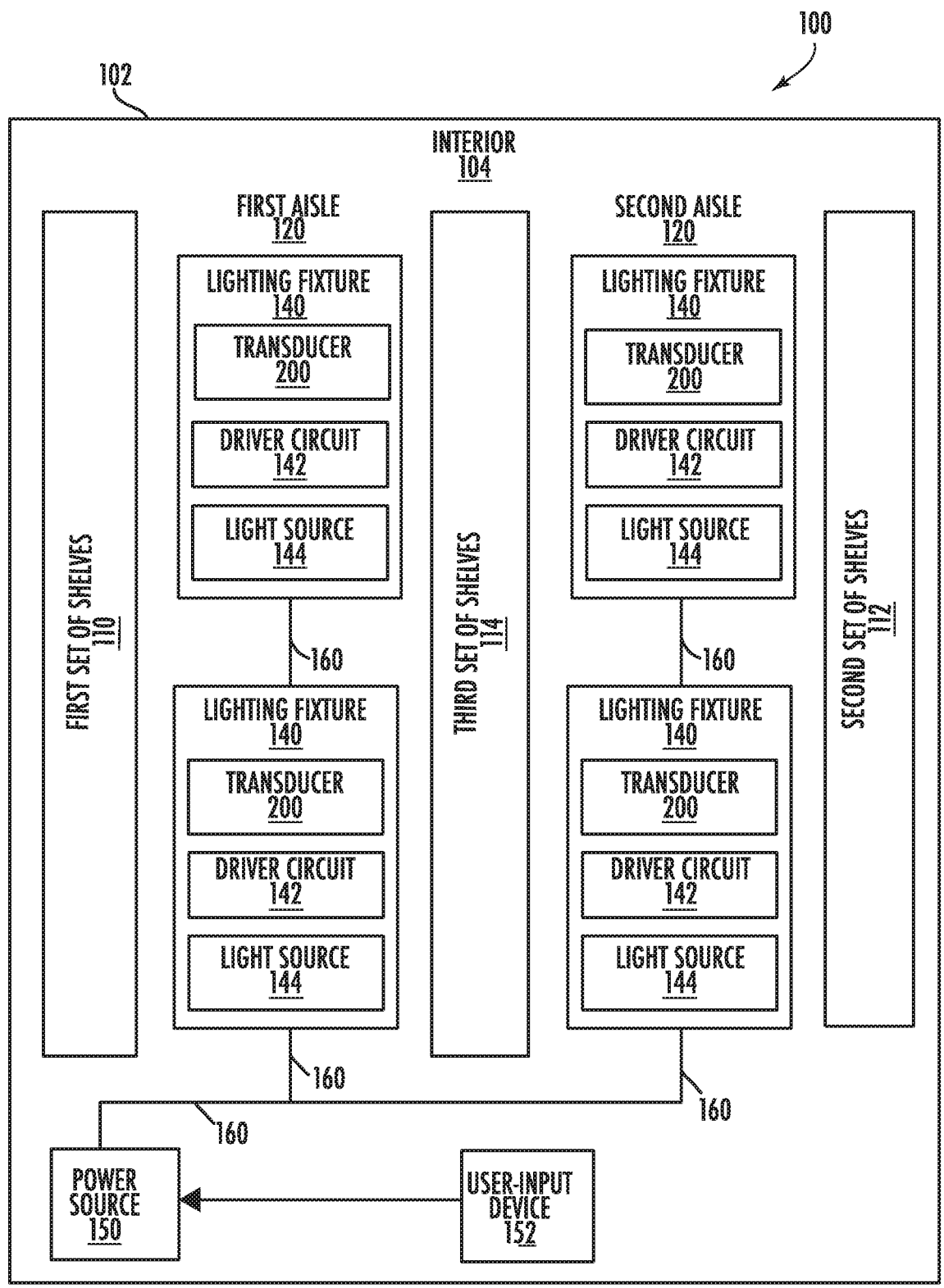
FIG. 10 provides a block diagram of an example lighting system for use in an example environment according to example embodiments of the present disclosure.

FIG. 10 depicts the lighting system 100 used in an example environment according to example aspects of the present disclosure. The environment can be, for instance, a building 102. As shown, the building 102 can define an interior 104 configured to accommodate a first set of shelves 110, a second set of shelves 112, and a third set of shelves 114 positioned between the first set of shelves 110 and the second sets of shelves 112. More specifically, the first set of shelves 110 can be spaced apart from the third set of shelves 114 to define a first aisle or walkway 120. In this manner, the first aisle 120 can accommodate one or more consumers shopping for items on the first set of shelves 110 and/or the third set of shelves 114. Additionally, the second set of shelves 112 can be spaced apart from the third set of shelves 114 to define a second aisle or walkway 122. In this manner, the second aisle 122 can accommodate one or more consumers shopping for items on the second set of shelves 112 and/or the third set of shelves 114.

As shown, the plurality of lighting fixtures 140 can receive the AC input power 160 from the power source 150, such as the mains power supply for the building 102. In example embodiments, the AC input power 160 provided to the plurality of lighting fixtures 140 can be adjusted (e.g., increased or decreased) via a user-input device 152. For instance, the user-input device 152 can include one or more mechanical devices (e.g., switch) of a control panel. Alternatively, the user-input device 152 can include a computing device having one or more processors and associated memory. More specifically, a user can adjust the AC input power 160 via a user interface associated with the computing device.

The example environment of FIG. 10 is provided for purposes of illustration and discussion. Those of ordinary skill in the art, using the disclosures provided herein, will understand that aspects of the present disclosure can be used in any suitable lighting application without deviating from the scope of the present disclosure.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A voltage transducer, comprising:
   an input operable to receive an alternating current input power;
   a current sink circuit operable to provide a current sinking output; and
   one or more control devices configured to:
      detect a change in a magnitude of the alternating current input power; and
      in response to detecting the change in the magnitude of the alternating current input power, control the current sink circuit to adjust the current sinking output.

2. The voltage transducer of claim 1, further comprising:
   a power conversion circuit configured to convert the alternating current input power to direct current power for powering the one or more control devices.

3. The voltage transducer of claim 2, wherein the power conversion circuit comprises at least one of a transformer, a rectifier, and a voltage regulator.

4. The voltage transducer of claim 2, wherein the one or more control devices are configured to:
   provide a control signal to the current sink circuit based on a sensing input received at the one or more control devices.

5. The voltage transducer of claim 4, wherein the sensing input comprises a direct current sensing input received from the power conversion circuit.

6. The voltage transducer of claim 4, wherein the control signal comprises a pulse width modulated control signal.

7. The voltage transducer of claim 1, wherein the current sink circuit comprises:
   an operational amplifier having an inverting input and a non-inverting input;
   a switching device; and
   a feedback loop coupled between an output of the operational amplifier and the inverting input of the operational amplifier.

8. The voltage transducer of claim 7, wherein the feedback loop comprises a feedback resistor.

9. The voltage transducer of claim 7, wherein the output of the operational amplifier controls operation of the switching device to adjust the current sink circuit based at least in part on the control signal received at the non-inverting input of the operational amplifier.

10. The voltage transducer of any claim 7, wherein the output of the operational amplifier controls operation of the switching device to be in a conducting state when a difference between a voltage associated with the control signal and a voltage associated with the feedback loop does not exceeds a threshold.

11. The voltage transducer of claim 10, wherein the output of the operational amplifier controls operation of the switching device to be in a non-conducting state when the difference between the voltage associated with the control signal and the voltage associated with the feedback loop exceeds the threshold.

12. The voltage transducer of claim 1, wherein the current sinking output is a dimming signal received at a control input associated with a driver circuit.

13. A method for controlling a lighting system, the method comprising:
   receiving, at an input of a voltage transducer, an alternating current input power;
   receiving, at one or more control devices, a sensing input from a power conversion circuit of the voltage transducer;
   providing, by the one or more control devices, a control signal to a current sink circuit of the voltage transducer based, at least in part, on the sensing input;
   adjusting, by the current sink circuit, a current sinking output based, at least in part, on the control signal; and
   responsive to adjusting the current sinking output, providing, by the current sink circuit, the current sinking output to a driver circuit of the lighting system to adjust a driver output the driver circuit provides to a light emitting diode (LED) light source.

14. The method of claim 13, wherein adjusting the current sinking output comprises controlling, with the current sink circuit, operation of a switching device of the current sink circuit based, at least in part, on a voltage associated with the control signal.

15. The method of any claim 14, wherein controlling operation of the switching device comprises:
   operating the switching device in a conducting state when a difference between a voltage associated with the control signal and a voltage associated with a feedback loop of the current sink circuit does not exceed a threshold.

16. The method of claim 15, wherein controlling operation of the switching device comprises:
   operating the switching device in a non-conducting state when a difference between the voltage associated with the control signal and a voltage associated with a feedback loop of the current sink circuit does exceed the threshold.

17. A lighting system, comprising:
   a first light source;
   a second light source;
   a driver circuit configured to provide a driver current;
   a voltage transducer comprising an input and a current sink circuit, the input operable to receive an alternating current input power from a power source, the current sink circuit operable to provide a current sinking output as a variable reference signal provided to a current splitter circuit configured to split the driver current into a first current for the first light source and a second current for the second light source based on the variable reference signal; and
   one or more control devices configured to:
      determine a magnitude associated with the alternating current input power; and
      control the current sink circuit to adjust the current sinking output based, at least in part, on the magnitude of the alternating current input power.

18. The lighting system of claim 17, wherein the current sink circuit comprises:
   an operational amplifier having an inverting input and a non-inverting input;
   a switching device; and
   a feedback loop coupled between an output of the operational amplifier and the inverting input of the operational amplifier.

19. The lighting system of claim 18, wherein the output of the operational amplifier is configured to control operation of the switching device to adjust the current sink circuit based at least in part on the control signal received at the non-inverting input of the operational amplifier.

20. The lighting system of claim 17, wherein the one or more control devices are configured to:
   provide a control signal to the current sink circuit based on a sensing input received at the one or more control devices.

* * * * *